US012426478B2

(12) United States Patent
Cao et al.

(10) Patent No.: US 12,426,478 B2
(45) Date of Patent: Sep. 23, 2025

(54) FLEXIBLE DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Xiang Yin, Guangdong (CN); Baixiang Han, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,596

(22) PCT Filed: Dec. 24, 2021

(86) PCT No.: PCT/CN2021/141060
§ 371 (c)(1),
(2) Date: Dec. 28, 2021

(87) PCT Pub. No.: WO2023/115508
PCT Pub. Date: Jun. 29, 2023

(65) Prior Publication Data
US 2024/0057448 A1 Feb. 15, 2024

(30) Foreign Application Priority Data
Dec. 22, 2021 (CN) .......................... 202111575880.1

(51) Int. Cl.
*H10K 59/80* (2023.01)
*H10K 77/10* (2023.01)
*H10K 102/00* (2023.01)

(52) U.S. Cl.
CPC ......... *H10K 59/873* (2023.02); *H10K 77/111* (2023.02); *H10K 2102/311* (2023.02)

(58) Field of Classification Search
CPC ............... H10K 59/873; H10K 77/111; H10K 2102/311; H10K 59/2723
See application file for complete search history.

(56) References Cited

U.S. PATENT DOCUMENTS

2021/0202594 A1* 7/2021 Jo .......................... H10K 59/121
2023/0109286 A1* 4/2023 Hwang ................ H10K 50/844
257/680

FOREIGN PATENT DOCUMENTS

CN 106206673 A 12/2016
CN 111463248 A 7/2020
(Continued)

OTHER PUBLICATIONS

International Search Report in International application No. PCT/CN2021/141060, mailed on Sep. 14, 2022.
(Continued)

*Primary Examiner* — Moazzam Hossain
(74) *Attorney, Agent, or Firm* — PV IP PC; Wei Te Chung (57) ABSTRACT

A flexible display panel is provided. The flexible display panel includes a substrate, a driving circuit layer disposed on one side of the substrate, a light emitting structure disposed on one side of the driving circuit layer away from the substrate, and a packaging layer disposed on one side of the light emitting structure away from the driving circuit layer,
(Continued)

wherein a buffer member is disposed on a surface of at least one layer of the packaging layer or the substrate.

14 Claims, 9 Drawing Sheets

(56) References Cited

FOREIGN PATENT DOCUMENTS

| | | | |
|---|---|---|---|
| CN | 111768700 A | 10/2020 | |
| CN | 112670300 A | 4/2021 | |
| CN | 113130569 A | 7/2021 | |
| CN | 113629110 A | 11/2021 | |
| KR | 20160001584 A | 1/2016 | |
| KR | 20170072721 A | 6/2017 | |

OTHER PUBLICATIONS

Written Opinion of the International Search Authority in International application No. PCT/CN2021/141060, mailed on Sep. 14, 2022.
Chinese Office Action issued in corresponding Chinese Patent Application No. 202111575880.1 dated Mar. 22, 2025, pp. 1-6.

* cited by examiner

FLEXIBLE DISPLAY PANEL AND DISPLAY DEVICE

BACKGROUND

Technical Field

The present application relates to the technical field of display, in particular to a flexible display panel.

Related Art

Display panels have been widely used in people's lives, such as mobile phones, computers, and televisions. Organic light emitting diode (OLED) displays have the advantages of active light emission, large view angle, wide color gamut, high brightness, fast response speed, low power consumption, flexible structure and the like, and thus are more and more popular in the market. OLED displays, also known as organic electroluminescent displays, are new flat panel displays.

In order to ensure the reliability of OLED displays, a series of reliability experiments are generally required to be carried out after the production of OLED displays. A falling sphere experiment is usually used to test the impact resistance of a screen. However, the traditional OLED display has the phenomena including black spots, bright spots, color spots and failure of full-color display when hit by a falling sphere. Therefore, the traditional OLED display has the problem of poor impact resistance.

Technical Problem

The embodiment of the present application provides a flexible display panel to alleviate the technical problem of poor impact resistance of the existing flexible display panel.

Technical Solution

The embodiment of the present application provides a flexible display panel.

The flexible display panel comprises:
- a substrate;
- a driving circuit layer disposed on one side of the substrate;
- a light emitting structure disposed on one side of the driving circuit layer away from the substrate;
- a packaging layer disposed on one side of the light emitting structure away from the driving circuit layer, wherein
- a buffer member is disposed on a surface of at least one layer of the packaging layer or the substrate.

In one embodiment, the buffer member is disposed on a surface of the packaging layer away from the light emitting structure.

In one embodiment, the buffer member is disposed on a surface of the substrate away from the driving circuit layer.

In one embodiment, the buffer member comprises a first buffer member and a second buffer member, the first buffer member is disposed on a surface of the substrate away from the driving circuit layer, the second buffer member is disposed on a surface of the packaging layer away from the light emitting structure, and a projection of the first buffer member on the substrate does not overlap a projection of the second buffer member on the substrate.

In one embodiment, a height of the first buffer member is less than a height of the second buffer member.

In one embodiment, the buffer member is a support column.

In one embodiment, the support column is disposed in an inverted T shape.

In one embodiment, the support column comprises one or more of a prism or a cylinder.

In one embodiment, a toughness of the buffer member is greater than a toughness of the substrate.

In one embodiment, a plurality of the support columns is disposed in an array.

Beneficial Effect

The beneficial effects are as follows: the present application provides a flexible display panel, the flexible display panel comprises a substrate, a driving circuit layer disposed on one side of the substrate, a light emitting structure disposed on one side of the driving circuit layer away from the substrate, and a packaging layer disposed on one side of the light emitting structure away from the driving circuit layer, wherein a buffer member is disposed on a surface of at least one layer of the packaging layer or the substrate. Since the buffer member is disposed on at least one layer of the packaging layer or the substrate of the flexible display panel in the present application, the impact resistance of the flexible display panel is enhanced, thus avoiding the problems of black spots, bright spots, color spots, failure of full-color display and the like when the display panel is impacted.

BRIEF DESCRIPTION OF THE DRAWINGS

The following describes specific implementations of the present application in detail with reference to the accompanying drawings, to make the technical solutions and other beneficial effects of the present application.

DETAILED DESCRIPTION OF INVENTION

The following clearly and completely describes technical solutions in embodiments of the present application with reference to the accompanying drawings in the embodiments of the present application. Apparently, the described embodiments are only some embodiments rather than all the embodiments of the present application. All other embodiments obtained by a person skilled in the art based on the embodiments of the present application without creative efforts shall fall within the protection scope of the present application.

In the description of the present application, it should be understood that orientation or position relationships indicated by the terms such as "center", "longitudinal", "transverse", "length", "width", "thickness", "on", "below", "front", "back", "left", "right", "vertical", "horizontal", "top", "bottom", "inside", "outside", "clockwise", and "anticlockwise" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present application. In addition, the terms "first" and "second" are used for descriptive purposes only and are not to be construed as indicating or implying relative importance or implicitly indicating the number of technical features indicated. Thus, features defined by "first" and "second" may explicitly or implicitly include one or more of the features. In the descriptions of the present application, "a plurality of" means two or more, unless otherwise definitely and specifically limited.

In the description of the present application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection or communication with each other; or the connection may be a direct connection, an indirect connection through an intermediary, or internal communication between two components, or may be an interactive relationship between two components. A person of ordinary skill in the art may understand the specific meanings of the foregoing terms in the present application according to specific situations.

In the present application, unless otherwise explicitly specified and defined, a first feature being "over" or "below" a second feature may mean that the first feature and the second feature are in direct contact, or the first feature and the second feature are not in direct contact but are in contact through another feature therebetween. Moreover, the first feature being "over", "above", and "on" the second feature includes that the first feature is directly above or obliquely above the second feature, or merely means that the first feature has a larger horizontal height than the second feature. That the first feature is "below", "under", and "underneath" the second feature includes that the first feature is right below the second feature and is not right below the second feature, or merely represents that a horizontal height of the first feature is lower than that of the second feature.

Many different implementations or examples are provided below to implement different structures of the present application. To simplify the disclosure of the present application, the following describes components and settings of particular examples. Certainly, the components and settings are merely examples, and are not intended to limit the present application. In addition, in the present application, reference numbers and/or reference letters may be repeated in different examples. Such repetition is intended to simplify and clarify the present application, and does not indicate a relationship between various implementations and/or settings that are discussed. In addition, the present application provides examples of various specific processes and materials, but a person skilled in the art may be aware of the applicability of other processes and/or the use of other materials.

In the present application, the pixel may be a pixel unit or a sub-pixel constituting the pixel unit, where the sub-pixel may be selected from one or more of a red sub-pixel, a blue sub-pixel, a green sub-pixel, and a white sub-pixel.

In the present application, the OLED display is a charge carrier double injection light-emitting device. Under the driving of an external voltage, an electron and a hole injected by an electrode recombine in the organic material to release energy and transfer the energy to a molecule of the organic light-emitting substance, so that the molecule is excited and transits from a ground state to an excited state. When the excited molecules change from the excited state back to the base state, light is emitted.

Embodiment I

The embodiment of the present application provides a flexible display panel to alleviate the technical problem of poor impact resistance of the existing flexible display panel.

Figure 1:
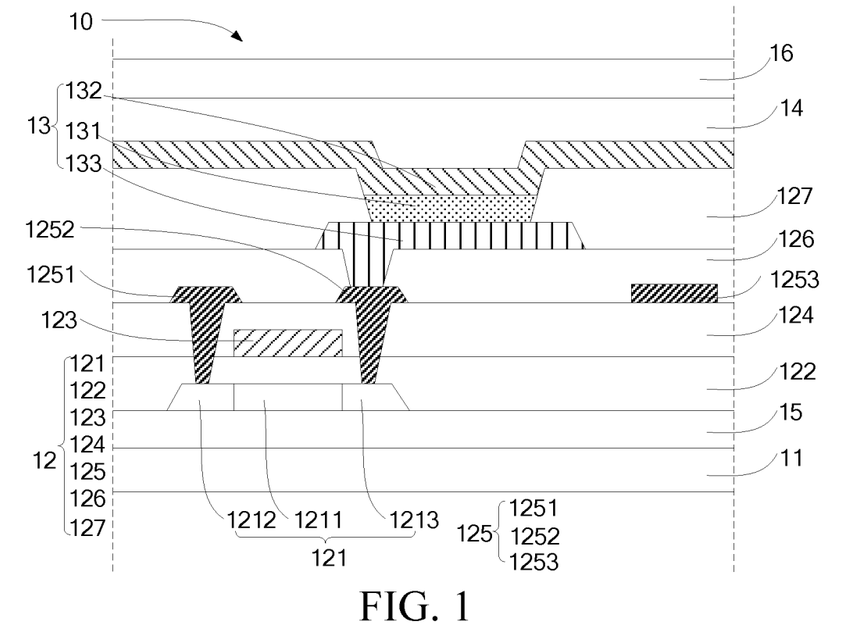
FIG. 1 illustrates a schematic diagram of a first structure of a flexible display panel provided by the embodiment of the present application.

Referring to FIG. 1, a schematic diagram of a first structure of a flexible display panel provided by the embodiment of the present application, the flexible display panel 10 includes a substrate 11, and a driving circuit layer 12, a light emitting structure 13 and a packaging layer 14 sequentially stacked on the substrate 11. A buffer member is disposed on the packaging layer 14. The buffer member 16 plays a buffer role when the flexible display panel 10 is impacted, and can more evenly absorb and release the stress, and reduce the risk of component damage caused by large single point force on the flexible display panel 10, thus improving the impact resistance and improving the display failure, and avoiding the problems of black spots, bright spots, color spots, failure of full-color display and the like when the flexible display panel 10 is impacted. Optionally, the substrate 11 may be a flexible substrate, including flexible substrates such as polyethylene terephthalate (PET), polyethylene naphthalate (PEN), polyimide (PI) films and ultra-thin glass films. Using the flexible substrate as the substrate 11, a flexible display panel can be fabricated to realize the bending, crimping and other special performances of the flexible display panel.

The driving circuit layer 12 includes an active layer 121, a gate insulating layer 122, a gate 123, an interlayer insulating layer 124, a source and drain layer 125, a planarization layer 126 and a pixel definition layer 127 sequentially stacked on the first buffer layer 15. The active layer 121 includes a channel region 1211, and a source region 1212 and a drain region 1213 located on two sides of the channel region 1211. The gate insulating layer 122 covers the active layer 121 and the first buffer layer 15, the gate 123 is disposed on the gate insulating layer 122, and the gate 123 is disposed corresponding to the channel region 1211.

The interlayer insulating layer 124 covers the gate 123 and the gate insulating layer 122. The source and drain layer 125 is disposed on the interlayer insulating layer 124. The source and drain layer 125 is patterned to form a source 1251, a drain 1252, a data line 1253 and the like. The source 1251 is connected with the source region 1212 through a via of the interlayer insulating layer 124. The drain 1252 is connected with the drain region 1213 through another via of the interlayer insulating layer 124.

The planarization layer 126 covers the source and drain layer 125 and the interlayer insulating layer 124. Disposing the planarization layer 126 can provide a flat film layer surface for the flexible display panel to improve the stability in fabricating the light emitting structure 13.

The pixel definition layer 127 covers the planarization layer 126. The pixel definition layer 127 is patterned to form pixel openings. The pixel openings expose part of an anode 133. The pixel definition layer 127 is patterned to form openings corresponding to pixels. The openings are used to accommodate light emitting materials and define the regions of the pixels. The light emitting materials of different colors are evaporated in the corresponding openings to form pixels of different colors.

It should be noted that the structure of the driving circuit layer 12 of the present application is not limited to the schematic diagram of this embodiment, the driving circuit layer 12 of the present application may also include more or fewer film layers, and the position relationship between the film layers is not limited to the schematic diagram of this embodiment. For example, the gate 123 may also be located below the active layer 121 to form a bottom gate structure. The driving circuit layer 12 is used to provide a driving voltage to the light emitting structure 13 to make the light emitting structure 13 emit light.

The light emitting structure 13 includes a light emitting module 131, a cathode 132 and an anode 133. The light emitting module 131 is formed by disposing a whole surface of light emitting materials of different colors on a surface of the driving circuit layer 12. The light emitting materials of different colors emit light of different colors. For example, red light emitting materials emit red light, green light emitting materials emit green light, and blue light emitting materials emit blue light.

The cathode 132 covers the light emitting module 131. The light emitting module 131 emits light under a joint action of the anode 133 and the cathode 132. Light emitting modules 131 of different colors emit light of different colors, so as to realize the full-color display of the flexible display panel.

The anode 133 is disposed on the planarization layer 126 and connected with the source 1251 or the drain 1252 through a via of the planarization layer 126. The present application is described by taking that the cathode 133 is connected with the drain 1252 as an example.

Optionally, the anode 133 may be a transparent electrode or a reflective electrode. If the anode 133 is a transparent electrode, the anode 133 may be formed of, for example, indium tin oxide (ITO), indium zinc oxide (IZO), ZnO or In2O3. If the anode 133 is a reflective electrode, the anode 133 may include, for example, a reflective layer formed of Ag, Mg, Al, Pt, Pd, Au, Ni, Nd, Ir, Cr or a combination thereof and a layer formed of ITO, IZO, ZnO or In2O3. However, the anode 133 is not limited thereto. The anode 133 may be formed of various materials and may also be formed as a single-layer or multi-layer structure.

It should be noted that whether the anode 133 is a transparent electrode or a reflective electrode depends on the light emitting direction of the flexible display panel. When the flexible display panel adopts top light emission, the anode 133 may be a transparent electrode or a reflective electrode. Of course, when the reflective electrode is adopted, the utilization rate of the light emitted by the light emitting module 131 can be improved. When the flexible display panel adopts bottom light emission, the anode 133 adopts a transparent electrode to improve the transmittance of light. This embodiment is described by taking that the flexible display panel adopts top light emission as an example. In order to improve the transmittance of light, the cathode 132 needs to be formed of a transparent conductive material. For example, the cathode 132 may be formed of transparent conductive oxide (TCO) such as ITO, IZO, ZnO or In2O3.

Optionally, the light emitting structure 13 may further include a hole injection layer (TIL) and a hole transport layer (HTL) disposed between the light emitting module 131 and the anode 133; and an electron injection layer (EIL) and an electron transport layer (ETL) disposed between the light emitting module 131 and the cathode 132. The hole injection layer receives holes transported by the anode 133, the holes are transported to the light emitting module 131 through the hole transport layer, the electron injection layer receives electrons transported by the cathode 132, and the electrons are transported to the light emitting module 131 through the electron transport layer. The holes and the electrons are bound at a position of the light emitting module 131 to produce excitons, and the excitons transition from an excited state to a ground state to release energy and emit light.

The packaging layer 14 covers the light emitting structure 13 to protect the light emitting module 131 of the light emitting structure 13 to prevent the invasion of water and oxygen from causing the light emitting module 131 to fail. Optionally, the packaging layer 14 may be packaged by adopting a thin film. For example, the packaging layer 14 may be a stack structure formed by sequentially stacking three films, i.e., a first inorganic packaging layer, an organic packaging layer and a second inorganic packaging layer, or a stack structure of more layers.

In FIG. 1, the buffer member 16 is disposed on a surface of the packaging layer 14. In fact, the buffer member may be disposed on a surface of the substrate 11. The buffer member may also be divided into a first buffer member and a second buffer member. The first buffer member is disposed on a surface of the substrate 11 away from the driving circuit layer, the second buffer member is disposed on a surface of the packaging layer 14 away from the light emitting structure, and a projection of the first buffer member on the substrate 11 does not overlap a projection of the second buffer member on the substrate 11. The following describes in detail several arrangements of the buffer member.

Embodiment II

Figure 2:
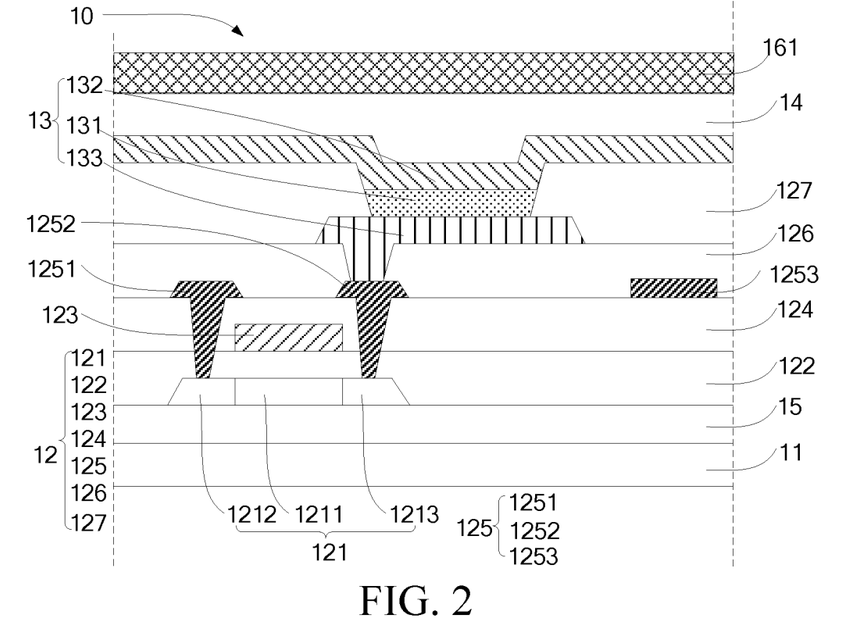
FIG. 2 illustrates a schematic diagram of a second structure of a flexible display panel provided by the embodiment of the present application.

Referring to FIG. 2, a schematic diagram of a second structure of a flexible display panel provided by the embodiment of the present application, a buffer member is disposed on a surface of the packaging layer 14 away from the light emitting structure 13 of a light emitting function layer, and the buffer member is a buffer layer 161. Optionally, a material of the buffer layer 161 may include inorganic materials such as silicon oxide (SiOx), silicon nitride (SiNx) and silicon oxynitride (SiON), the buffer layer 161 may be a metal material, and the toughness of the metal material is greater than the toughness of the protective substrate 11. When the flexible display panel 10 is impacted, since the toughness of the buffer layer 161 is greater than the toughness of the substrate 11, the buffer layer 161 will deform earlier than the substrate 11 to prevent the substrate 11 of the flexible display panel 10 from being damaged.

The buffer layer may be fabricated in an independent process or integrated into the existing process (such as the packaging process of array/OLED). For example, when manufacturing a display panel, a manufacturer of the display panel may manufacture the buffer layer 161 as a whole with the substrate 11, the driving circuit layer 12, the light emitting structure 13 and the packaging layer 14, or manufacture the substrate 11, the driving circuit layer 12, the light emitting structure 13 and the packaging layer 14 as a whole and manufacture the buffer layer 161 separately, and then the separately manufactured buffer layer 161 is used on the display panel without a buffer layer.

Figure 3:
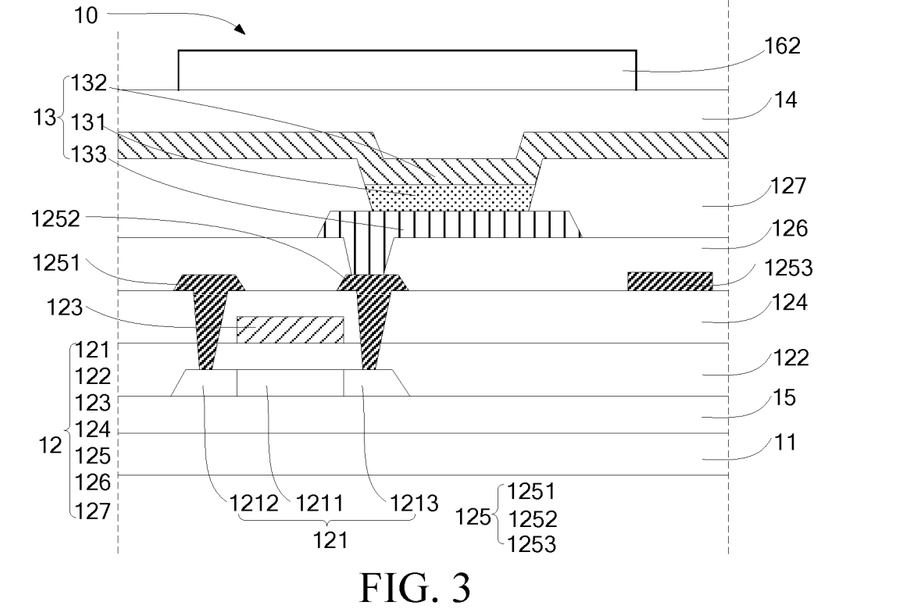
FIG. 3 illustrates a schematic diagram of a third structure of a flexible display panel provided by the embodiment of the present application.

Referring to FIG. 3, in one embodiment, the buffer member includes at least one support column 162, and the toughness of the support column 162 is greater than the toughness of the substrate 11. Since the toughness of the support column 162 is greater than the toughness of the substrate 11, when the flexible display panel 10 is impacted, the support column 162 will deform firstly to prevent the substrate 11 from being damaged.

The support column may be cylindrical, prismatic or in other shapes, and the specific shape is not limited herein.

Figure 4:
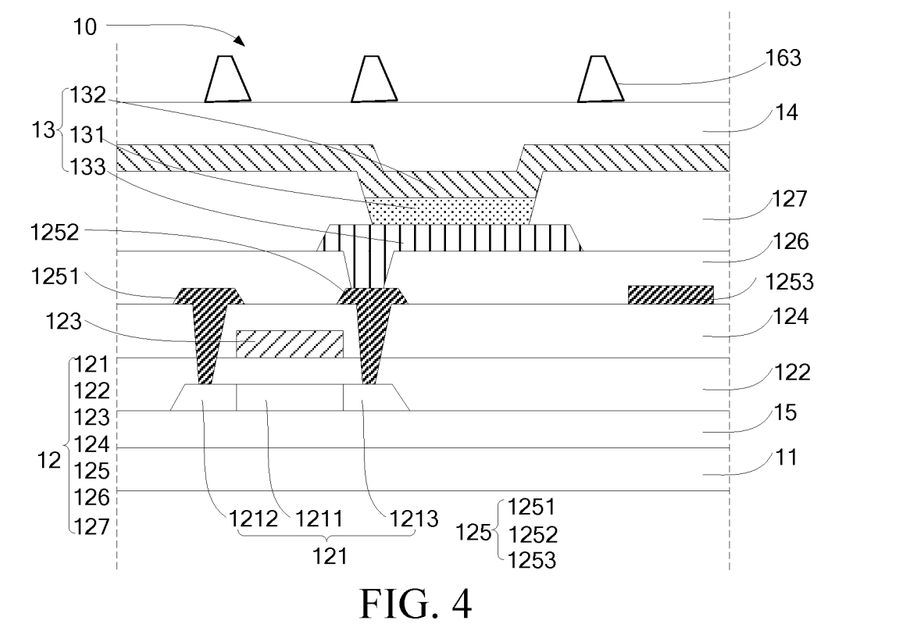
FIG. 4 illustrates a schematic diagram of a fourth structure of a flexible display panel provided by the embodiment of the present application.

Referring to FIG. 4, in one embodiment, the support column 163 is prismatic, and the support column is disposed in an inverted T shape. Since the support column 163 is disposed in an inverted T shape, a contact surface between the support column 163 and the packaging layer 14 is large. Therefore, the support column 163 can evenly release a force on the packaging layer 14 to prevent the packaging layer 14 from being damaged due to a large force at a certain point.

The support columns 163 may be disposed at an interval as required, may be disposed at an equal distance, or may be disposed at any distance. The specific arrangement is not limited herein.

Embodiment III

Figure 5:
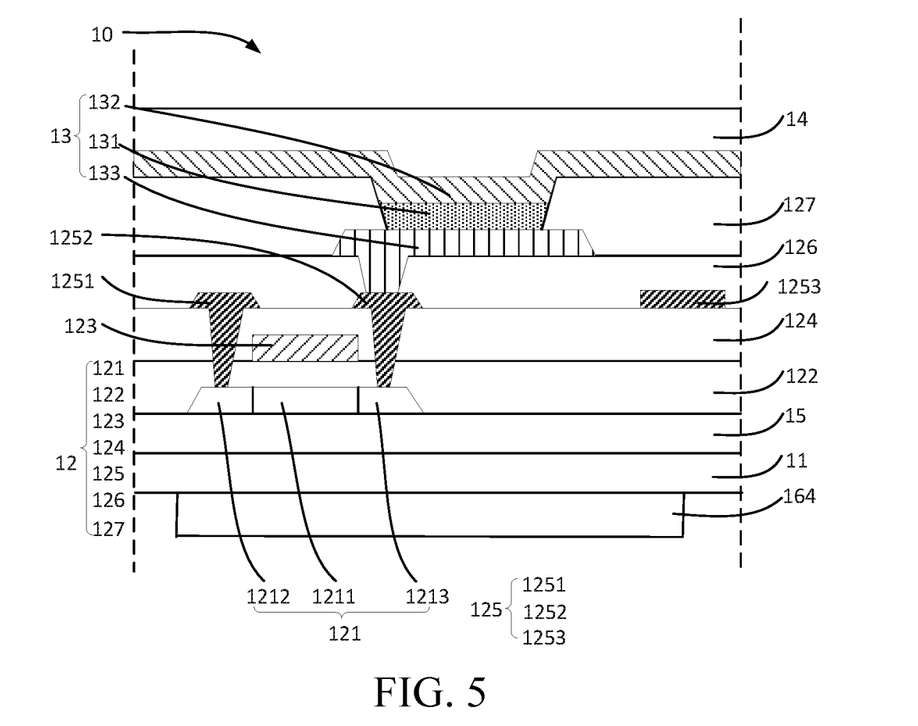
FIG. 5 illustrates a schematic diagram of a fifth structure of a flexible display panel provided by the embodiment of the present application.

Referring to FIG. 5, a schematic diagram of a fifth structure of a flexible display panel provided by the embodiment of the present application, a buffer member is disposed on a surface of the substrate away from the driving circuit layer, and the buffer member is a support column 164. When the flexible display panel 10 is impacted, the support column 164 will share part of the force on the flexible display panel 10, so the force received by other parts of the flexible display panel 10 is reduced. In addition, the support column 164 can resist the force from module mechanisms (such as hinge mechanism, crimping mechanism and telescoping mechanism) to prevent these mechanisms from damaging the flexible display panel.

Figure 6:
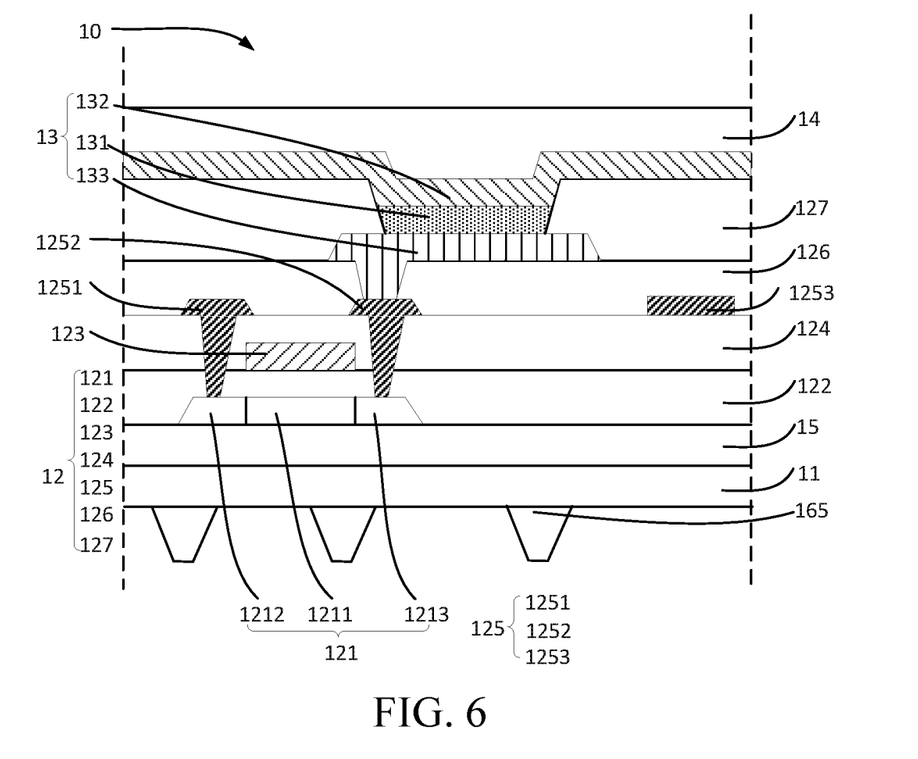
FIG. 6 illustrates a schematic diagram of a sixth structure of a flexible display panel provided by the embodiment of the present application.

Referring to FIG. 6, in one embodiment, the support column 165 is prismatic and is disposed in an inverted T shape. Since the support column 165 is disposed in an inverted T shape, a contact surface between the support column 165 and the substrate 11 is large. Therefore, the support column 165 can evenly release a force on the substrate 11 to prevent the substrate 11 from being damaged due to a large force at a certain point. The support columns 165 may be disposed at an interval as required. The specific arrangement is not limited herein. The support columns may be disposed at an equal distance, or may be disposed at any distance.

Figure 7:
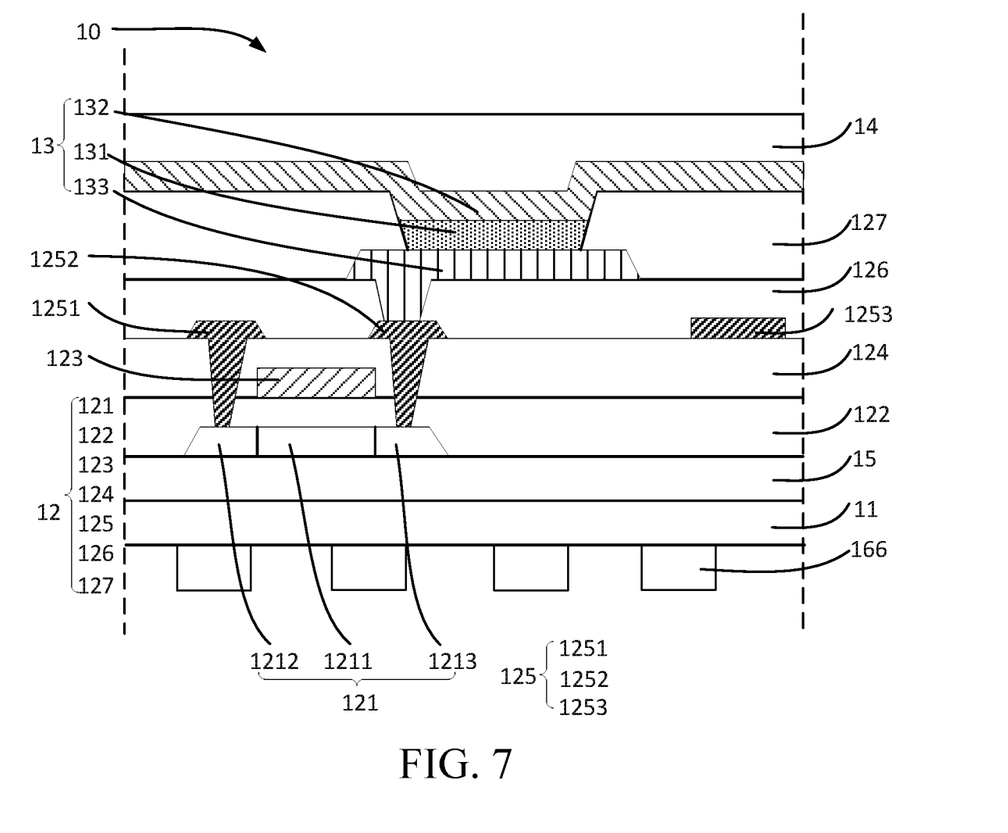
FIG. 7 illustrates a schematic diagram of a seventh structure of a flexible display panel provided by the embodiment of the present application.

Referring to FIG. 7, a plurality of support columns 166 is disposed in an array. Since the plurality of support columns 166 are disposed in an array, the force on each buffer member 166 is uniform, so as to prevent the buffer member 166 from deforming differently due to different forces and thereby affecting the performance of the display panel.

Figure 8:
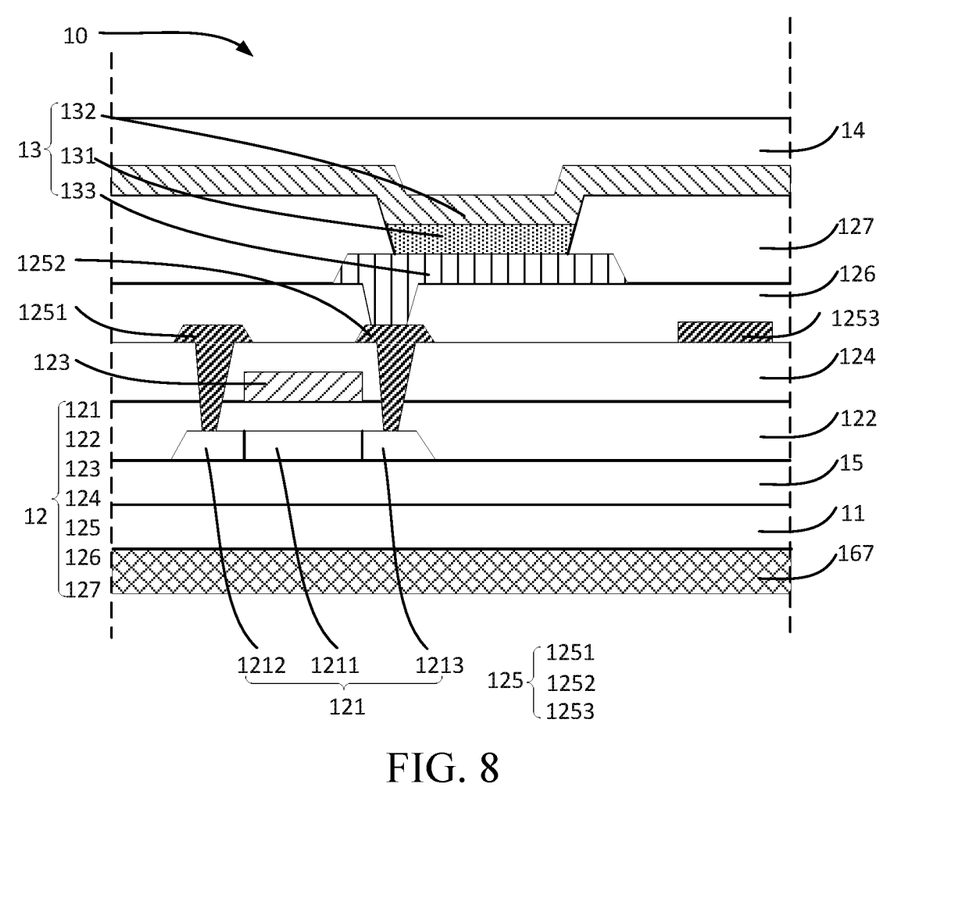
FIG. 8 illustrates a schematic diagram of an eighth structure of a flexible display panel provided by the embodiment of the present application.

Referring to FIG. 8, a buffer member is disposed on a surface of the substrate 11 away from the driving circuit layer 12. The buffer member is a buffer layer 167. The buffer layer 167 may be fabricated in an independent process or integrated on the flexible substrate 21, The buffer layer 167 can further prevent unwanted impurities or pollutants (such as moisture and oxygen) from diffusing from the substrate 11 to devices to be possibly damaged by these impurities or pollutants, and can also resist the force from module mechanisms (such as hinge mechanisms, crimping mechanisms and telescoping mechanisms) to prevent these mechanisms from damaging the flexible display panel.

Embodiment IV

Figure 9:
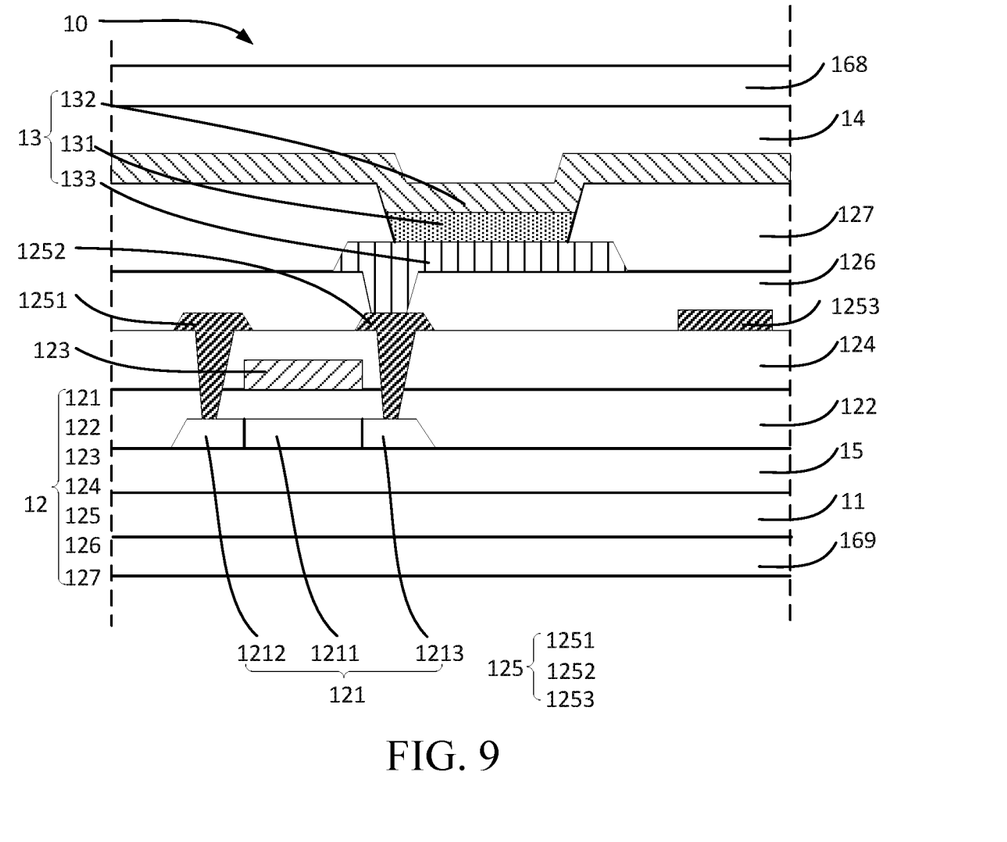
FIG. 9 illustrates a schematic diagram of a ninth structure of a flexible display panel provided by the embodiment of the present application.

Referring to FIG. 9, in one embodiment, a first buffer member 169 is disposed on one side of the substrate 11 away from the driving circuit layer 12, and a second buffer member 168 is disposed on one side of the packaging layer 14 away from the light emitting structure 13. Projections of the first buffer member 169 and the second buffer member 168 on the substrate 11 do not overlap. In addition, the first buffer member 169 and the second buffer member 168 may be made of the same material or different materials. The selection of specific materials is not limited herein.

In one embodiment, both the first buffer member and the second buffer member are made of flexible organic materials, a material of the first buffer member is polyimide, and a material of the second buffer member is polyacrylate. Since the flexible organic materials have better buffer performance, the materials can better release stress, so as to improve the impact resistance of the display panel and improve the display failure. At the same time, since the bending performance of the flexible organic materials is good, the bending resistance of the flexible display panel can be improved when used in the flexible display panel.

Figure 10:
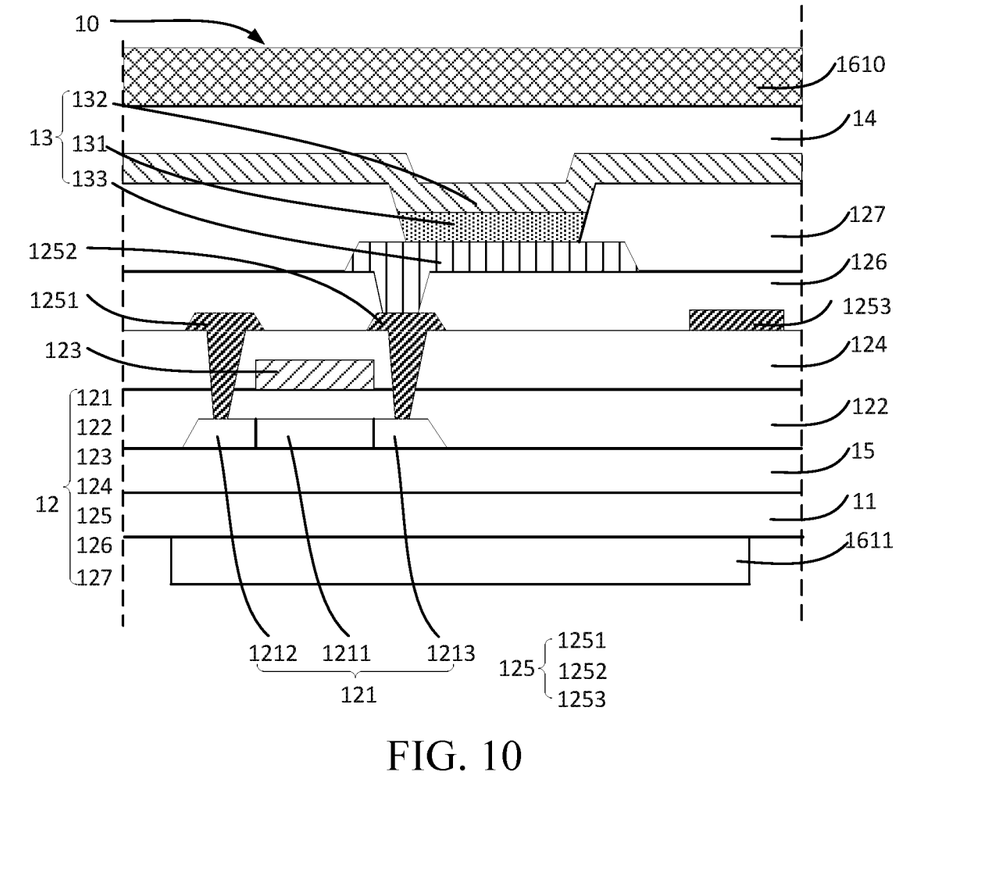
FIG. 10 illustrates a schematic diagram of a tenth structure of a flexible display panel provided by the embodiment of the present application.

Referring to FIG. 10, in one embodiment, the first buffer member 1611 and the second buffer member 1610 are made of different materials and are in different shapes, the first buffer member 1611 is a support column and the second buffer member 1610 is a buffer layer. When the flexible display panel 10 is impacted, both the support column 1611 and the buffer layer 1610 play a buffer role to share a part of the impact force on the flexible display panel 10 and prevent other parts of the flexible display panel from being damaged due to an excessive force. The shape of the support column 1611 is not limited herein, and may be a T shape or cylindrical shape.

In one embodiment, the height of the first buffer member is less than the height of the second buffer member. A difference between the height of the first buffer member and the height of the second buffer member is not limited herein and may be set according to specific needs. For example, the second buffer member may be 10 nm or 20 nm higher than the first buffer member.

Figure 11:
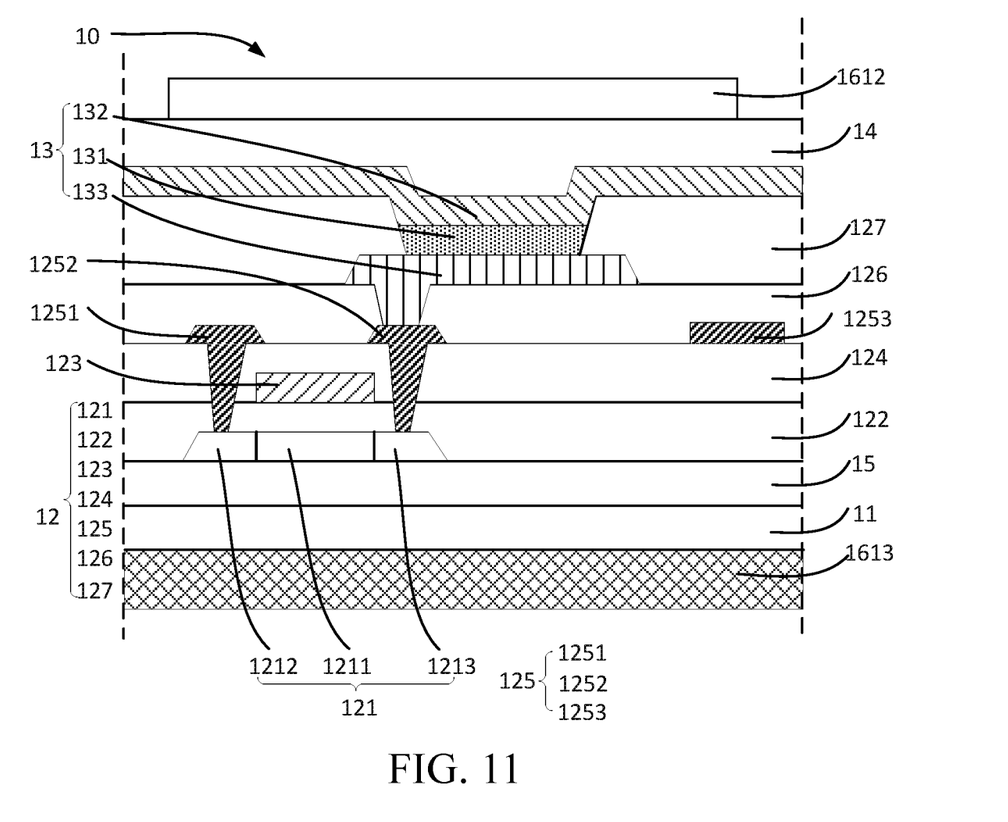
FIG. 11 illustrates a schematic diagram of an eleventh structure of a flexible display panel provided by the embodiment of the present application.

Referring to FIG. 11, in one embodiment, the first buffer member 1613 and the second buffer member 1612 are made of different materials and are in different shapes, the second buffer member 1612 is a support column and the first buffer member 1613 is a buffer layer. When the flexible display panel 10 is impacted, both the support column 1612 and the buffer layer 1613 play a buffer role to share a part of the impact force on the flexible display panel 10 and prevent other parts of the flexible display panel from being damaged due to an excessive force.

The buffer layer 1613 may be fabricated in an independent process or integrated into the existing process (such as the packaging process of array/OLED). For example, when manufacturing a display panel, a manufacturer of the display panel may manufacture the buffer layer 161 as a whole with the substrate 11, the driving circuit layer 12, the light emitting structure 13 and the packaging layer 14, or manufacture the substrate 11, the driving circuit layer 12, the light emitting structure 13 and the packaging layer 14 as a whole and manufacture the buffer layer 161 separately, and then the separately manufactured buffer layer 161 is used on the display panel without a buffer layer. The shape of the support column 1612 is not limited herein, and may be a T shape or cylindrical shape.

The present application provides a flexible display panel, including a substrate, a driving circuit layer disposed on one side of the substrate, a light emitting structure disposed on one side of the driving circuit layer away from the substrate, and a packaging layer disposed on one side of the light emitting structure away from the driving circuit layer, and a buffer member is disposed on a surface of at least one layer of the packaging layer or the substrate. Since the buffer member is disposed on at least one layer of the packaging layer or the substrate of the flexible display panel in the present application, the impact resistance of the flexible display panel is enhanced, thus avoiding the problems of black spots, bright spots, color spots, failure of full-color display and the like when the display panel is impacted.

The present application provides a display device. The display device includes a device body and the flexible display panel described above.

In the above embodiments, the description of each embodiment has its own emphasis. For the parts not detailed in one embodiment, please refer to the relevant description of other embodiments.

The technical features in the foregoing embodiments may be randomly combined. For concise description, not all possible combinations of the technical features in the embodiments are described. However, provided that combinations of the technical features do not conflict with each other, the combinations of the technical features are considered as falling within the scope described in this specification.

The foregoing embodiments describe the flexible display panel provided in the embodiments of the present application. Although the principles and implementations of the present application are described by using specific examples in this specification, the descriptions of the foregoing embodiments are merely intended to help understand the method and the core idea of the method of the present application. A person of ordinary skill in the art should understand that modifications may be still made to the technical solutions recorded in the foregoing embodiments or equivalent replacements may be made to some technical features thereof, and these modifications or replacements do not cause the essence of the corresponding technical solutions to depart from the scope of the technical solutions of the embodiments of the present application.

What is claimed is:

1. A flexible display panel, comprising:
   a substrate;
   a driving circuit layer disposed on a surface of the substrate;
   a light emitting structure disposed on one side of the driving circuit layer away from the substrate;
   a packaging layer disposed on one side of the light emitting structure away from the driving circuit layer, wherein
   a buffer member is disposed on a surface of at least one layer of the packaging layer or the substrate;
   wherein the buffer member comprises a first buffer member and a second buffer member, the first buffer member is disposed on an opposite surface of the substrate from the driving circuit layer, the second buffer member is disposed on a surface of the packaging layer away from the light emitting structure, and an orthographic projection of the first buffer member on the substrate does not fully overlap an orthographic projection of the second buffer member on the packaging layer;
   wherein the second buffer member is made of flexible organic material.

2. The flexible display panel according to claim 1, wherein a height of the first buffer member is less than a height of the second buffer member.

3. The flexible display panel according to claim 1, wherein the buffer member is a support column.

4. The flexible display panel according to claim 3, wherein the support column is disposed in an inverted T shape.

5. The flexible display panel according to claim 3, wherein the support column comprises one or more of a prism or a cylinder.

6. The flexible display panel according to claim 1, wherein a toughness of the buffer member is greater than a toughness of the substrate.

7. The flexible display panel according to claim 3, wherein a plurality of the support columns is disposed in an array.

8. A display device, comprising a device body and the flexible display panel according to claim 1, wherein the flexible display panel comprises:
   a substrate;
   a driving circuit layer disposed on one side of the substrate;
   a light emitting structure disposed on a surface of the driving circuit layer away from the substrate;
   a packaging layer disposed on one side of the light emitting structure away from the driving circuit layer, wherein
   a buffer member is disposed on a surface of at least one layer of the packaging layer or the substrate;
   wherein the buffer member comprises a first buffer member and a second buffer member, the first buffer member is disposed on an opposite surface of the substrate from the driving circuit layer, the second buffer member is disposed on a surface of the packaging layer away from the light emitting structure, and an orthographic projection of the first buffer member on the substrate does not fully overlap an orthographic projection of the second buffer member on the packaging layer;
   wherein the second buffer member is made of flexible organic material.

9. The display device according to claim 8, wherein a height of the first buffer member is less than a height of the second buffer member.

10. The display device according to claim 8, wherein the buffer member is a support column.

11. The display device according to claim 10, wherein the support column is disposed in an inverted T shape.

12. The display device according to claim 10, wherein the support column comprises one or more of a prism or a cylinder.

13. The display device according to claim 8, wherein a toughness of the buffer member is greater than a toughness of the substrate.

14. The display device according to claim 10, wherein a plurality of the support columns is disposed in an array.

* * * * *